United States Patent [19]

Migeon et al.

[11] Patent Number: 4,983,831
[45] Date of Patent: Jan. 8, 1991

[54] TIME-OF-FLIGHT ANALYSIS METHOD WITH CONTINUOUS SCANNING AND ANALYZER TO IMPLEMENT THIS METHOD

[75] Inventors: Henri-Noël Migeon, Jouy le Moutier; Bernard Rasser, Paris, both of France

[73] Assignee: Cameca, Courbevoie, France

[21] Appl. No.: 282,325

[22] Filed: Dec. 9, 1988

[30] Foreign Application Priority Data

Dec. 11, 1987 [FR] France .................. 87 17288

[51] Int. Cl.$^5$ ............................ H01J 37/26
[52] U.S. Cl. ........................ 250/309; 250/287; 250/397
[58] Field of Search .......... 250/307, 309, 281, 282, 250/287, 397

[56] References Cited

U.S. PATENT DOCUMENTS

| | | | |
|---|---|---|---|
| 3,517,191 | 6/1970 | Liebl | 250/309 |
| 3,628,009 | 12/1971 | Ome et al. | 250/309 |
| 3,845,305 | 10/1974 | Liebl | 250/309 |
| 4,107,527 | 8/1978 | Cherepin et al. | 250/309 |
| 4,778,993 | 10/1988 | Waugh | 250/309 |

FOREIGN PATENT DOCUMENTS 3144604 5/1983 Fed. Rep. of Germany .

OTHER PUBLICATIONS

Nuclear Instruments & Methods in Physics Research, vol. B18, Nos. 4-6, Feb. 1987, pp. 446-451, Elsevier Science Publish, Sensitive, Low Damage Surface Analysis Using Resonance Ionization of Sputtered Atoms, M. J. Pellin, et al.

Nuclear Instruments & Methods in Physics Research, vol. 187, No. 1, Aug. 1981, pp. 143-151, North-Holland Publishing Company, Beam Optics in Secondary Ion Mass Spectrometry H. Liebl.

Primary Examiner—Bruce C. Anderson
Attorney, Agent, or Firm—Oblon, Spivak, McClelland, Maier & Neustadt

[57] ABSTRACT

A time-of-flight method and apparatus of analysis comprising a first step of continuously scanning the surface of a solid sample to be analyzed with a primary particles beam to liberate secondary particles from the sample and to thereby ionize the secondary particles. A second step forms a secondary particles beam and makes it travel through a path which is long enough for secondary particles with different energy levels or different masses to have substantially different times of flight. Then, the secondary particles are discriminated by deflecting them at an angle which is variable periodically as a function of time, with the same period as that of the scanning by the primary particles beam, but with a fixed phase shift such that the secondary particles have a given time of flight and are deflected in a pre-determined direction, irrespective of the point on the sample from which these secondary particles have been liberated. Then the secondary particles that are moving in the pre-determined direction are selected and detected.

10 Claims, 4 Drawing Sheets

TIME-OF-FLIGHT ANALYSIS METHOD WITH CONTINUOUS SCANNING AND ANALYZER TO IMPLEMENT THIS METHOD

BACKGROUND OF THE INVENTION

1. Field of the Invention

The invention concerns a method for the analysis of solid samples by time-of-flight discrimination of particles liberated from this sample. It also concerns an analyzer to implement this method Time-of-flight analysis is applicable notably to mass spectrometry but can be also applied to energy analysis for particles having one and the same mass.

A method for time-of-flight analysis of sputtered particles consists in:

scanning the surface of a solid sample by a beam of particles called primary particles in order to liberate particles, called secondary particles, from the sample;

ionizing the secondary particles, when they are being liberated or after they have been liberated, some of them may be already ionized during the sputtering process;

accelerating them by means of an electrical field;

forming a beam of secondary particles and making it travel through a path which is long enough for secondary particles of different speeds to have substantially different times of flight;

subsequently discriminating among the secondary particles on the basis of their time-of-flight differences.

2. Description of the Prior Art

Since a sample is analyzed successively at different points, the fastest secondary particles liberated from a given point tend to catch up with the slowest secondary particles liberated earlier at another point of the sample. A known method used to prevent overlapping, in time, of particles having different starting points and different times of flight, consists in making a temporal selection by cutting up, by pulses, the primary particle beam or secondary particle beam. The drawback of this prior art method is that it lengthens the time of analysis and necessitates a complicated device to cut up either of these beams. In another known method, a continuous beam of primary particles is employed, and the electrical field used to extract and accelerate the secondary particles is cut up in pulses. The drawback of all known methods in which the primary beam is continuous but where the measurement of the flow of secondary particles is not continuous is loss of information because the beam of primary particles erodes the sample continuously while the measurements are made only at discrete instants These methods therefore have lower sensitivity of analysis than continuous measurement methods.

There are known methods of mass or energy analysis in which continuous measurements are made. These methods achieve high resolution by using geometrical selection instead of temporal selection to separate secondary particles emitted by distinct points of the sample. These methods consist, for example, in dispersing the secondary particles having different masses by means of a magnetic field. However, they generally require complicated and costly devices, which are not entirely warranted except for obtaining very high resolution. There are also known methods of analysis which achieve continuous measurement and geometrical separation by using far simpler devices such as a quadripole to perform mass spectrometry, for example. These devices are less costly and are used when low resolution suffices as their drawback is low sensitivity, these devices can work only on secondary low-energy particles, and consequently reduce the electrical field which gathers and accelerates the secondary particles. The result of this is low gathering efficency and, hence low sensitivity.

Besides, modern instruments of analysis should be capable of giving an image of the sample during the analysis, for example, to observe grains in mineralogy or in metallurgy, or else to observe implantations in a microelectronic device.

SUMMARY OF THE INVENTION

Accordingly, an object of the present invention, therefore, is to propose a continuous method for time-of-flight analysis which can be implemented by means of an inexpensive device and which can be used to obtain an image of the analyzed sample.

To achieve these results, the device according to the invention combines a time-of-flight selection with a geometrical selection of secondary particles. It enables implementation by means of a simple device giving satisfactory resolution for a great many applications. This method further gives an image of the analyzed sample. Variants of this method, which consist in the addition of standard dispersing devices, enable an increase in resolution for applications where high resolution is required. One variant of this method simultaneously gives several images corresponding to secondary particles with different times of flight respectively, and enables simultaneous measurement of flows of secondary particles with different times of flight respectively. This variant notably has the advantages of shortening the period of analysis and reducing the consumption of the sample.

According to the invention, a method for time-of-flight analysis consists in:

periodically scanning the surface of a solid sample to be analyzed with a beam of particles called primary particles, to thereby liberate so-called secondary particles from the sample;

ionizing the secondary particles, some of which are already charged;

accelerating the secondary particles by an electrical field;

forming a beam of secondary particles, and making them travel through a path which is long enough for secondary particles with different energy levels or different masses to have substantially different times of flight;

then, discriminating among the second particles on the basis of their time-of-flight differences, by bringing the secondary particles with a given time of flight to a pre-determined direction, irrespectively of the place, on the sample, from which they have been liberated, in deflecting the beam of secondary particles along an angle which may vary according to the point of emission of the secondary particles, and at periodic instants having a constant phase shift with respect to the deflection previously applied to the primary particles which liberated them from the sample.

This method, therefore, makes it possible to obtain a time-of-flight filtered image of the sample.

DESCRIPTION OF PREFERRED EMBODIMENTS

Figure 1:
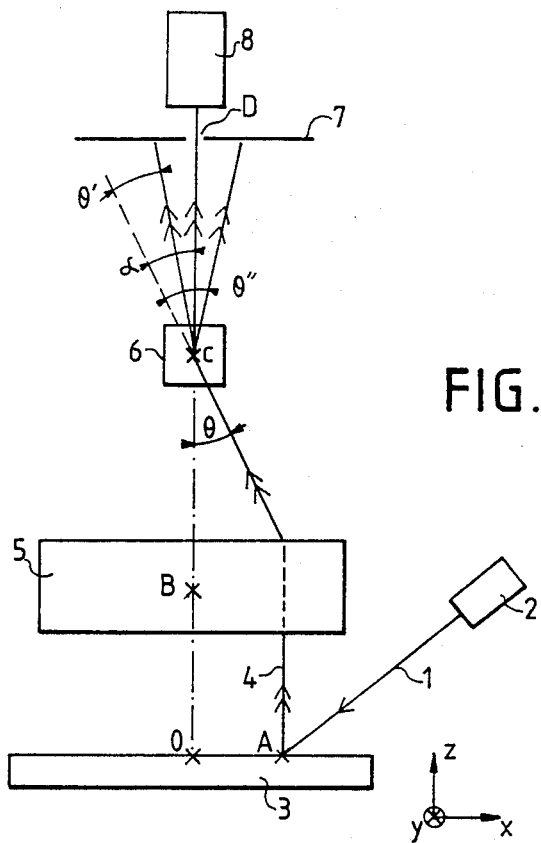
FIG. 1 illustrates the implementation of the method according to the invention.

FIG. 1 illustrates the method according to the invention, in showing how it can be used to discriminate among secondary particles according to their starting points and their times of flight. A source 2 projects a beam 1 of primary particles, in scanning the surface of a sample 3 Let us consider only those secondary particles 4 liberated at the instant to, at a point A on the surface of a solid sample 3. Some of them have an electrical charge q, due to their ionization. The ionized secondary particles are accelerated by an electrical field which is applied to the surface of the sample 3 and gives them an energy $E_o$. Each secondary particle has a speed depending on its mass and energy. This energy depends on the charge q of the particle and the accelerating electrical field. The particles liberated at the point A then form a beam 4.

The points of the space considered are identified in an orthonormal reference oxyz, o being a point at the center of the surface of the sample 3, the axis oz being perpendicular to this surface, and the axes oy and ox being parallel to this surface.

A directional focusing device 5 deflects the beam 4 to make it go through a fixed point C belonging to the axis oz, irrespectively of the position of the point A on the surface of the sample. For a given point A, the beam 4 reaches C in making an angle $\theta$ with oz. The time of flight of each secondary particle, in going from A to C, depends on the speed of this particle. The particles therefore do not all go to C at one and the same instant, although they have all left A at the instant $t_o$. A deflection device 6, with its optical center located at the point C, deflects the beam 4 by an angle $\alpha$ which is variable as a function of time. If, at an instant $t_o+t_v$, this angle $\alpha$ has the value $\theta$ corresponding to the point A, the particles going to the point C at this instant are brought to the axis oz. The particles going to C before or after this instant are respectively deflected by angles $\theta'$ and $\theta''$ which are different from $\theta$. The respective values of $\theta'$ and $\theta''$ depend on the direction of the scanning. A selection device 7 has a pinpoint input D located on the axis oz. Only the particles brought to the axis oz thus go through the opening D of the selection device 7, and are then collected by a detection device 8 which gives a current proportionate to the electrical charge collected. The particles collected are therefore those having a time of flight $t_v$ such that the deflection angle is equal to $\theta$ at the instant $t_o+t_v$.

For the secondary particles, emitted at the point A at the instant $t_o$ and having a given time of flight $t_v$, to be collected by the detector 8, it is necessary and sufficient for the device 6 to deflect the beam 4, at the instant $t_o+t_v$, by an angle $\alpha$ equal to the angle $\theta$ which is a function of the position (x, y) of the point A at the surface of the sample. This device 6 thus enables the selection of the time of flight and the starting point of the secondary particles collected by the detector 8. The source of the primary particles 2 periodically scans the surface of the sample 3 by a deflection of the beam 1: hence the position of the point A varies in time, and the angle $\theta$, made by the beam 4 with the axis oz when entering the deflection device 6, varies as a function of time.

The method according to the invention essentially comprises in:

deflecting the secondary particles beam 4 by a variable angle $\alpha$ which is a periodic function of time, having the same period as that of the deflection of the primary particles beam 1, and in such a way that secondary particles with a given time of flight are deflected at periodic instants having a constant phase shift with respect to the instants of deflection of the primary particles which liberated them from the sample 3, to bring them into a pre-determined direction which is oz, irrespectively of the starting point of these particles on the sample 3;

selecting the secondary particles 4, moving in the pre-determined direction oz;

measuring the flow of the secondary particles 4 thus selected, this flow representing the distribution on the surface of the sample to be analyzed 3, of particles having the given time of flight.

Figure 2:
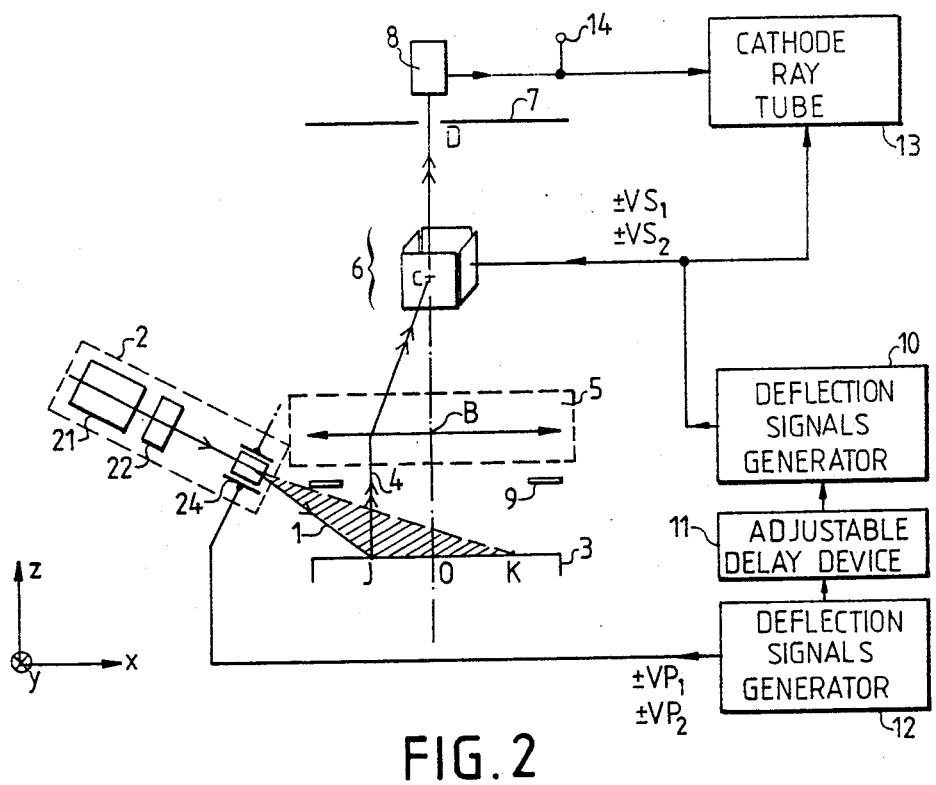
FIG. 2 gives a schematic view of a first embodiment of an analyzer to implement the method of the invention.

FIG. 2 shows a first embodiment of an analyzer to implement the method according to the invention. This first embodiment has a source 2, giving a primary particles beam 1, which is oblique to the axis oz. The source 2 consists of a ion source 21, an optical device 22 and a deflection device 24. The device 22 may consist of a mass spectrometer. The device 24 has two pairs of electrostatic deflection plates connected to an output of a deflection signals generator 12. The directional focusing device 5 consists of an electrostatic lens. The selection device 7 is a diaphragm pierced with a hole D, behind which a detector 8 is placed. An output terminal 14 of the analyzer is connected to an output of the detector 8 which gives it a signal to measure the flow of secondary particles received by the detector 8 at each instant. The deflection device 6 is formed by two pairs of electrostatic deflection plates. The deflection plates 24 are mutually perpendicular in sets of two, just as the deflection plates 6 are mutually perpendicular in sets of two, in order to enable a scanning of the sample 3 in two perpendicular directions ox and oy.

The plates 6 are connected to an output of a deflection signals generator 10. This deflection signals generator 10 is synchronized by a signal given to it by the generator 12, this signal being transmitted by a device 11 with an adjustable delay. A cathode ray tube 13 is used to restore an image of the sample 3. The control gate of the tube 13 is connected to the output of the detector 8 to modulate the intensity of the electron beam of this tube depending on the measurement of the flow of secondary particles, brought into the direction oz. The deflection means of the tube 13 are coupled to the output of the generator 10 to produce a scan of the tube 13 screen, this scan being homologous to the deflection applied to the secondary particles beam and in synchronism with the measuring signal given by the detector 8.

A ring-shaped electrode 9 enables the application of an electrical field to extract and accelerate the ionized secondary particles liberated from the surface of the sample 3. In this FIG. 2, the hatched zones represent the shift of the primary beam 1 to scan a segment JK on the surface of the sample 3.

Figure 3:
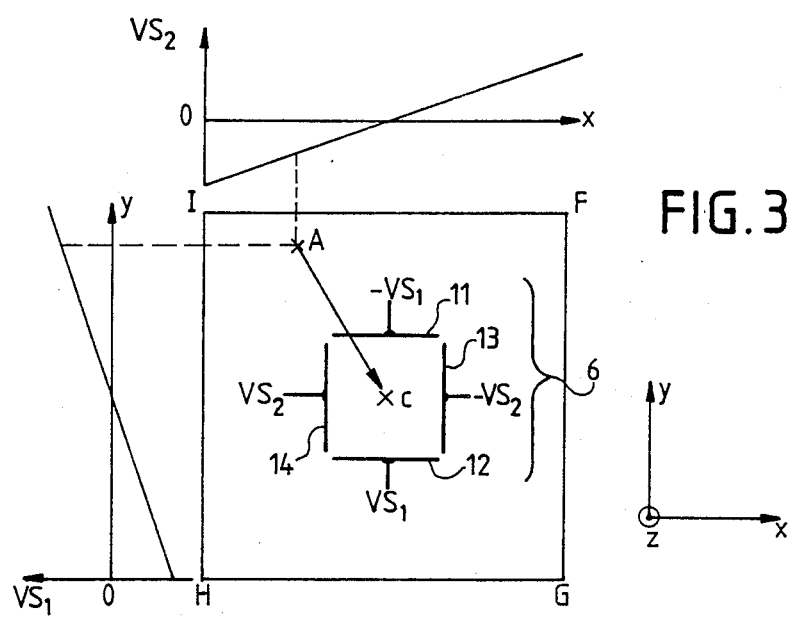
FIGS. 3, 4 and 5 show the working of this first embodiment.

FIG. 3 shows a more detailed view of the structure of the deflection device 6. This device has four plates, 11 to 14, respectively carried to potentials $-VS_1$, $+VS_1$, $-VS_2$, $+VS_2$. The plates 11 and 12 enable deflection in the direction oy while the plates 13 and 14 enable deflection in the direction ox. They are placed symmetrically with respect to the optical center C of the deflection device 6. FIG. 3 also shows two graphs giving the value of the potential $VS_2$ and the value of the potential $VS_1$ for a deflection of the beam 4 corresponding to each of the points of a square surface FGHI of the sample to be analyzed. This figure therefore shows the relationship between the potentials of the plates and the position (xy) of the point A from which the secondary particles beam 4 comes at a given instant. The deflection angle $\alpha$ in the plane zox is connected to the potential $VS_2$ by a relationship with the form:

$$tg\alpha = VS_2 \times \frac{\ell}{e_o} \times \frac{1}{d}$$

where d is the distance between the plates 13 and 14, and 1 is the length of these plates along oz.

The deflection angle in the plan yoz is related to the potential $VS_1$ by a similar formula.

Figure 4:
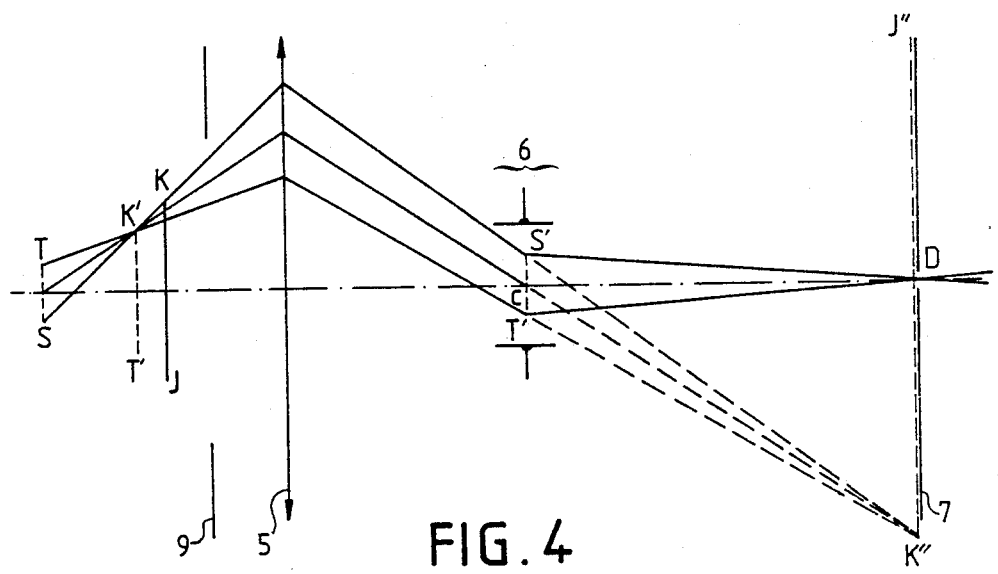

FIG. 4 shows the path of the secondary particles liberated at the end K of a segment JK of the surface of the sample, as well as the effect of the deflection by the deflection device 6. The electrode 9 gives a virtual image J'K' of the segment JK of the sample 3, this virtual image J'K' being illuminated by the virtual illumination pupil ST. The lens 5 gives real images J"K" and S'T' respectively, of the image J'K' and its illumination pupil ST. The deflection device 6 deflects the beam coming from the point K' towards the opening D of the selection diaphragm 7. This figure shows that it is advantageous to place the optical center C of the scanning device 6 at the real image S'T' of the illumination pupil, for this image then remains fixed during the scan, from J to K, by the primary particles beam 1. It is also advantageous to place the selection diaphragm 7 in the plane of the real image J,K' of the surface of the sample, for the dimension of the image of a point y is minimum. Consequently the selection is optimal.

The primary particles which go, at an instant $t'_o$, to the optical center of the deflection device 24 reach the surface of the sample 3 at an instant $t'_o+t_p$, with a practically identical time of flight $t_p$, irrespectively of the point of impact of the beam 1 between the points J and K. The secondary particles liberated by these primary particles have a time of flight $t_v$ in going from the surface of the sample 3 up to the optical center C of the deflection device 6. These secondary particles therefore go to the point C at the instant $t'_o+t_p+t_v$. The time of flight $t_v$ is practically the same, regardless of the position of the point of impact of the beam 1 between the points J and K. It depends solely on the energy and mass of the secondary particles liberated from the sample 3.

For these secondary particles to be brought back to the axis oz by the device 6, the device 6 should deflect them, at the instant $t'_o+t_p+t_v$, by an angle corresponding to the position of the point of impact of the beam 1 at the instant $t'_o+t_p$. The surface of the sample 3 is scanned by the beam 1 in a pre-determined path, controlled by the differences in potential applied to the deflection plates 24. The deflection signals generator 12 gives the two pairs of plates 24, respectively, periodic potentials, $\pm VP_1$ and $\pm VP_2$, as a function of time and having a triangular shape, in this example, to achieve a frame scan and a line scan. The generator 10 gives potentials, $\pm VS_1$ and $\pm VS_2$ respectively, to the two pairs of plates of the deflection device 6. The potentials, $\pm VS_1$ and $\pm VP_1$, and $\pm VS_2$ and $\pm VP_2$, respectively, have the same frequency but have a phase shift corresponding to the duration $t_p+t_v$.

Figure 5:
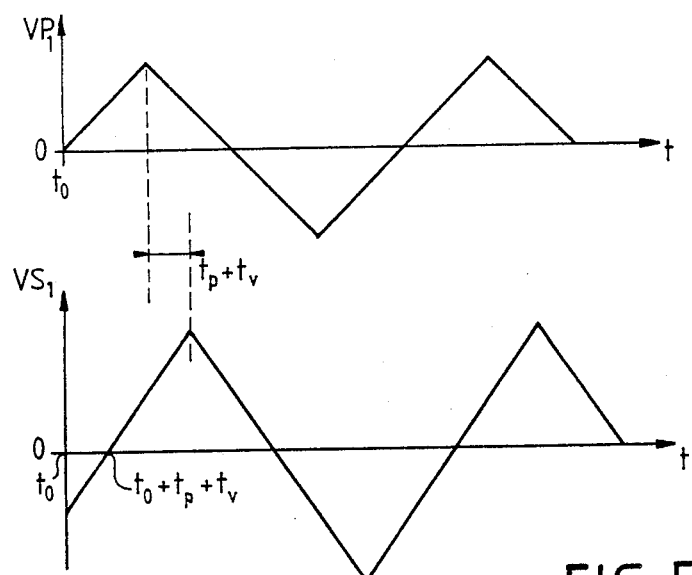

FIG. 5 shows the graphs of the potentials $VP_1$ and $VS_1$, which correspond to the deflection along the axis oy. The potentials $VP_2$ and $VS_2$, corresponding to the deflection along the axis ox, have similar graphs but different frequencies, and are not shown. The potentials $VP_1$ and $VS_1$ have graphs with the same period, but phase shifted by a constant delay. By adjusting the delay to the value $t_p+t_v$, it is possible to select those secondary particles having a given time of flight $t_v$.

The making of the deflection signals generators 10 and 12 is not described in greater detail because it is within the scope of those skilled in the art.

Figure 6:
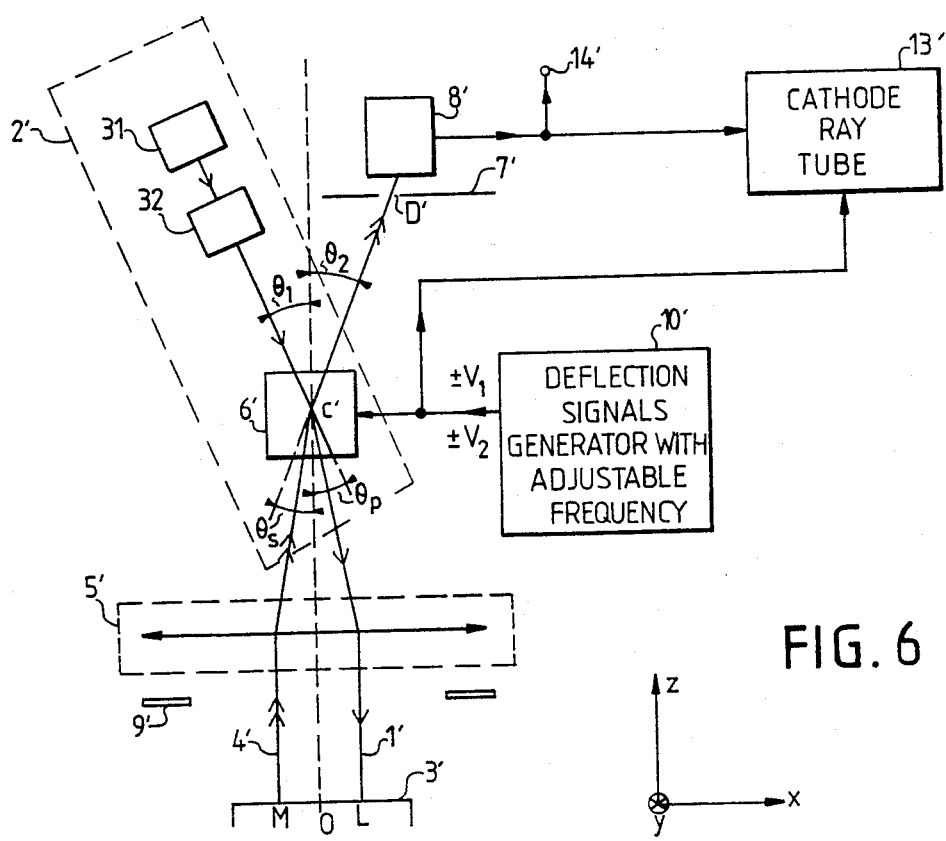
FIG. 6 gives a schematic view of a second embodiment of an analyzer to implement the method according to the invention.

FIG. 6 gives a schematic view of a second embodiment of an analyzer to implement the method according to the invention, wherein the means to deflect the primary particles beam and to deflect the secondary particles beam are merged. However, there is a phase shift between the deflection undergone by primary particles and the deflection undergone by secondary particles liberated by these very same primary particles, for they do not pass into the deflection means at the same instant.

This embodiment is possible only when the primary particles and the secondary particles have opposite charges. This embodiment has a primary beam source 2', formed by a ion source 31, an optical device 32, which may be a mass spectrometer, and a deflection device 6' which is also used to deflect the secondary particles. This embodiment further has a directional focusing device 5' formed, for example, by an electronic lens; and a ring-shaped electrode 9' used to apply an electrical field to extract and accelerate the ionized secondary particles liberated from a sample 3'. A particle selection device 7' is formed by a diaphragm pierced with a pinpoint opening D'. A detector 8' collects the particles that have gone through the diaphragm 7' and gives a measuring signal to an output terminal 14' of the analyzer.

The position of these elements is identified in an orthonormal reference oxyz, the point o being placed at the center of the surface of the sample 3', the axis oz being normal to this surface and the axes ox and oy being parallel to this surface. The optical axis of the ion source 31 and of the optical device 32 are aligned with the optical center C' of the deflection device 6', in forming an angle $\theta_1$ with the axis oz. The optical axis of the opening D' of the diaphragm 7' and the optical axis of the detector 8' also go through the point C', in forming an angle $\theta_2$ with the axis oz. The optical axis of the lens 5' is merged with the axis oz and also goes through the center C'.

A deflection signals generator 10, with adjustable frequency, gives potentials $\pm V_1$ and $\pm V_2$ to the deflection device 6' to achieve a frame scan and line scan respectively. The device 6 is formed, for example, by two pairs of orthogonal plates. The primary particles beam 1', which reach the point C' at a given instant $t_o''$, are deflected by the device 6' by an angle $\theta_p$ with the optical axis of the source 31 and of the optical device 32. Then they are brought into a direction close to the axis oz by the lens 5'. At the same instant $t_o''$, secondary particles are deflected by the device 6' in the direction C'D'. They will therefore go through the diaphragm 7' and will be detected by the detector 8'.

If the device is made in such a way that the angles $\theta_1$ and $\theta_2$ are equal, it is possible to receive, at the detector 8', secondary particles having a charge opposite to that of the primary particles and coming from a direction which is symmetrical, with respect to the axis oz, with the direction of primary particles leaving the device 6'.

The primary particles going through the center C' at the instant $t_o''$ strike the surface of the sample 3' at a point L, at a later instant $t_o'' + t_p$, where $t_p$ is the time of flight between the points C' and L for the primary particles. The secondary particles reaching the center C' at the instant $t_o''$ have been liberated previously, from a point M of the surface of the sample 3', at an instant $t_o'' - t_s$, where $t_s$ is the time of flight between M and C' for the secondary particles. A period $T = t_s + t_p$ thus elapses between the instant when the primary particles go through the point C' and the instant when the secondary particles, liberated by these primary particles, go through this very same point C'. Consequently, to detect secondary particles, which have a given time of flight $t_v$ and which have been liberated from the point L by primary particles having passed through the point C' at the instant $t_o''$, it is necessary and sufficient for the potentials $\pm V_1$ and $\pm V_2$ to resume, at the instant $t_o'' + T$, the same values as at the instant $t_o''$, to deflect the secondary particles towards the opening D' since, in this example, the angles $\theta_2$ and $\theta_1$ are equal.

In this example, the angles $\theta_1$ and $\theta_2$ are in the plane xoz and the line scan is done in the direction ox. The generator 10' should therefore give a line deflection signal with a period T, chosen as a function of the time of flight of the secondary particles to be detected. The secondary particles which do not have a time of flight corresponding to this period are not detected for they reach the point C' in advance or behind time, and they are therefore not deflected by an angle bringing them exactly into the direction of the opening D'. Thus, there actually is time-of-flight selection. The amplitude of the line deflection signals $\pm V_2$ defines the width ML of the surface analyzed on the sample 3'. The mean value of these signals corresponds to the value of the angles $\theta_1$ and $\theta_2$. The embodiment of the signals generator 10' is not described in greater detail for it is within the scope of those skilled in the art.

An image of the surface of the sample, for a given time of flight, can be obtained by applying the measurement signal given by the detector 8' to the control grid of the cathode ray tube 13'. The deflection means of the ray tube 13' have deflection signals generators (not shown) controlled by the potentials $\pm V_1$ and $\pm V_2$, given by the output of the generator 10'.

This implementing of this second embodiment is more complicated than that of the first one, because the making of a lens 5', optimized simultaneously for both beams 1' and 4', is more complicated than the making of the lens 5 optimized only for the beam 4.

On the contrary, the second embodiment makes it possible to bring the lens 5' closer to the sample, since it is not necessary to leave an oblique passage for the primary particles beam. This enables the use of a lens 5 with a shorter focal distance, hence with fewer aberrations, and enables the making of a smaller probe.

It has the drawback of requiring the primary particles and the secondary particles to have opposite charges.

The above-described two embodiments have high resolution. The resolution can be further increased for certain applications by adding an energy or mass filtering or focusing device. For, in the case of a mass analysis of secondary particles, the energy distribution is a drawback which affects the resolution power, in terms of mass, of the device.

Two alternatives of the above embodiments make it possible to limit this effect A first alternative embodiment consists in incorporating an energy filtering device between the sample and the detector, to select the secondary particles having an energy level included in a band with a width compatible with the desired resolution in terms of mass. A filtering device of this type, however, has the drawback of eliminating a portion of the secondary particles and, therefore, of reducing the sensitivity of the analyzer. In the case of the first embodiment, the energy filtering device may be placed either between the sample and the secondary particles deflection device or between this deflection device and the detector. In the second embodiment, it must be placed between the secondary particles deflection device and the detector. The making of a filtering device of this type is a standard one. It may comprise an of electrostatic sector with an energy selection slit.

In a second approach, a temporal focusing device is interposed in the path of the secondary particles in order to compensate for time-of-flight differences due to differences in energy without compensating from time-of-flight differences due to differences in mass. The resolution in terms of mass is thus heightened while, at the same time, a wide energy band is preserved: hence, an improvement is achieved without loss of sensitivity. This focusing device can be used only in the first embodiment. It may be interposed between the sample and the secondary particles deflection device It has a standard form. It may comprise an electrostatic device wherein those particles that have the highest energy values travel along the longest path.

For certain applications requiring even greater resolution in terms of mass, the above two embodiments may be provided with a mass spectrometer of a standard type, placed between the selection diaphragm and the detector.

An alternative embodiment of the two above-described embodiments can be used to select particles corresponding to several different times of flight and coming from different points of the surface of the sample. It can be used to simultaneously obtain several images of one and the same sample, corresponding to these different times of flight. This alternative embodiment obviously has the advantage of reducing the time taken for an analysis, and of giving images for different materials of the sample.

Figure 7:
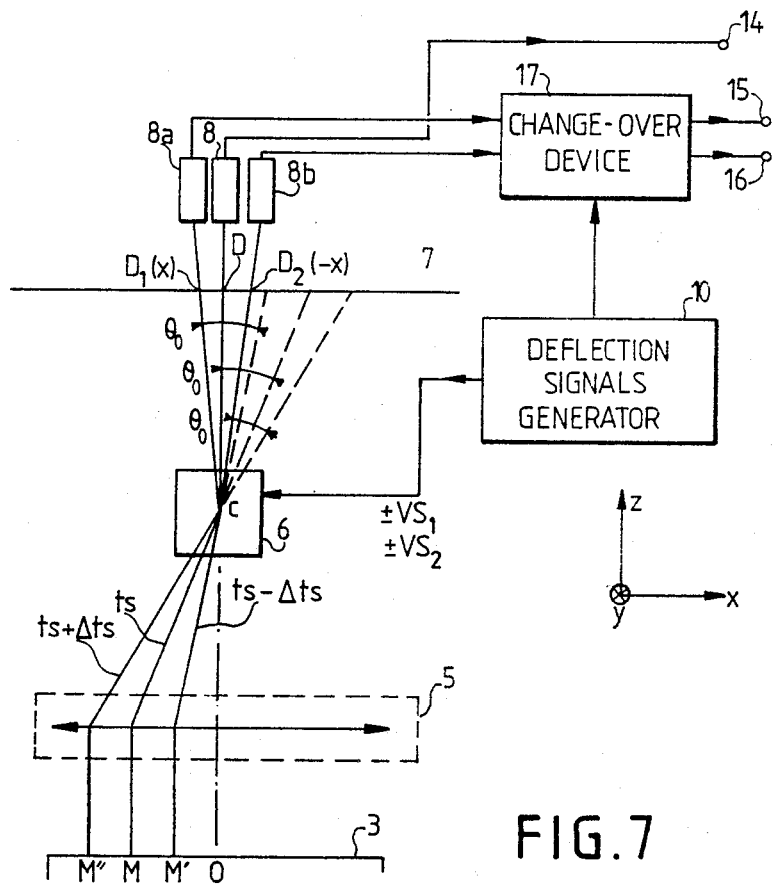
FIG. 7 gives a schematic view of an alternative embodiment of the analyzer to implement the method according to an invention.

FIG. 7 shows the working of this alternative, applied to the first embodiment, but showing neither the means that achieve scanning by the primary particles beam nor the extraction electrode. This alternative can be applied in a similar m to that employed in the second embodiment.

At a given instant $t_o+t_s$, secondary particles reach the point C. These secondary particles have been emitted from the point M at the instant $t_o$ and have a time of flight $t_s$ from M to C. These particles are deflected towards the point D which they reach at the instant $t_o+t_s+t'_s$, $t'_s$ being the time of flight of these particles from C to D.

At the instant $t_o+t_s$, there also arrive, at C, secondary particles with different times of flight $t_s+\Delta t_{S1}$, $t_s+\Delta t_{S2}$,... etc., coming from different points M', M",... on the surface of the sample. These particles are deflected by the same angle $\downarrow_O$ and, therefore, reach other points $D_1$, $D_2$,... etc. at the instants $t_o+t_s+t'_{S1}$, $t_o+t_s+t'_{S2}$,... etc., where $t''_{S1}$, $t'_{S2}$,...etc. are their times of flight from C to $D_1$, $D_2$...etc.

To begin with, in order to simplify the explanation, let it be assumed that the scanning of the sample is one-dimensional, and parallel to ox.

The points M', M, M" have been scanned successively by the primary particles beam during one and the same line scan parallel to ox. The slowest secondary particles emitted by the point M' and the fastest secondary particles emitted by the point M" reach the point C at the same instant and, therefore, undergo one and the same angular deflection $\theta_o$ in going through the deflecting device 6. As the length of the path MC is far greater than the dimensions of the surface analyzed on the sample 3, it can be shown that the position of the points $D_1$ and $D_2$ is constant, for fixed time-of-flight differences $\pm\Delta t_s$, irrespectively of the positions M, M', M" on one and the same scan line. It must be noted that the points $D_1$ and $D_2$ are symmetrical with respect to D and are located on a straight line parallel to ox and passing through D.

Furthermore, it must be noted that those times of flight which are greater than $t_s$ are on a first half line and those times of flight which are smaller than $t_s$ are on a second half line, these half lines being symmetrical with respect to D. These two half lines permutate if the scanning direction is inverted. Should the scanning be one-dimensional, it would therefore be possible to detect all the secondary particles having times of flight: $t_s$, $t_s-\Delta t_s$, $t_s+\Delta t_s$, by making three openings in the diaphragm 7 at the points D, $D_1$, $D_2$, and by placing three independent detectors behind these openings.

In practice, a simultaneous analysis of several times of flight is complicated by the fact that the scanning is two-dimensional. The time of flight $t_s\pm\Delta t_s$ then no longer corresponds to the two single points $D_1$ and $D_2$ on the surface of the diaphragm 7, for there is then also a two dimensional shift of the point of impact of the secondary particles having times of flight which are different from that corresponding to the point D.

Figure 8:
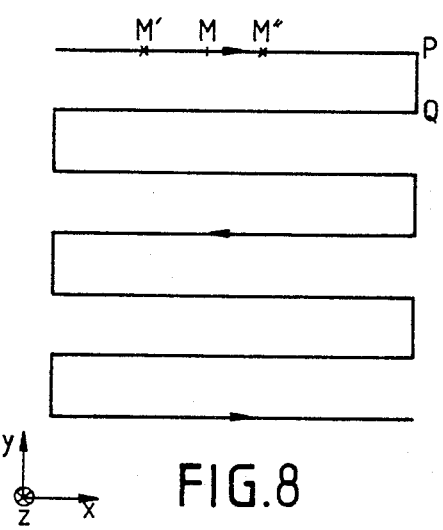
FIGS. 8 and 9 show the working of this second embodiment.

FIG. 8 shows the path travelled by the primary beam scan on the surface of the sample 3 when the line deflection signal has a triangular shape with a slope which is identical both upwards and downwards, and when the frame deflection signal has a staircase shape corresponding to interspaces with a width PQ.

Figure 9:
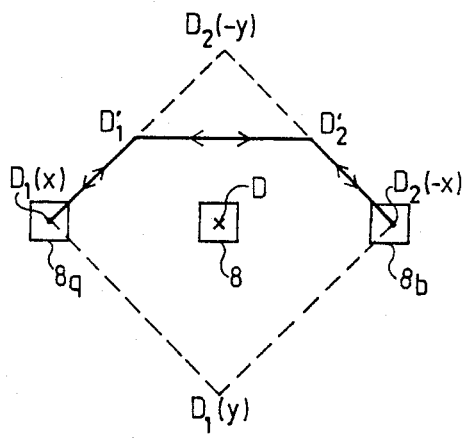

FIG. 9 shows the impact points of the secondary particles having a time of flight $t_s\pm\Delta t_s$ on the plane of the diaphragm 7. They reach the point $D_1(x)$ throughout the scanning of a line in the direction of the axis ox, and reach the point $D_2(-x)$ throughout the scanning of a line in the direction opposite to that of the axis ox, the points $D_1(x)$ and $D_2(-x)$ being two points which are symmetrical to D and are located on a straight line parallel to ox.

Conversely, the particles having a time of flight $t_s-\Delta t_s$ reach the point $D_2(-x)$ throughout the scanning of a line in the direction of the axis ox, and reach the point $D_1(x)$ throughout the scanning of a line in the direction opposite to that of the axis ox.

During short time intervals, located between the scanning of two successive lines, and corresponding, for example, to the segment PQ in FIG. 8, the particles with times of flight $t_s\pm\Delta t_s$ do not reach $D_1(x)$ or $D_2(-x)$ but reach the points of three segments: $D_1(x)D'_1$, $D'_1D'_2$, $D'_2D_2(-x)$, the points $D'_1$ and $D'_2$ being recorded on the sides of a rhombus $D_1(x)$, $D_2(-y)$, $D_2(-x)$, $D_1(y)$, where $D_2(y)$ and $D_2(-y)$ are the points of impact of the secondary particles having times of flight $t_s+\Delta t_s$, where the scan would be a one-dimensional scan parallel to oy.

Since the duration of a line change (PQ) is negligible when compared with the duration of a line scan, the period during which the particles arrive at the segments $D_1(x)D'_1$, $D'_1D'_2$, $D'_2D_2(-x)$, is also negligible as compared with the period during which they fall at the points $D_1(x)$ and $D_2(-x)$. It may therefore be enough, in many cases, to detect only those particles at the points $D_1(x)$ and $D_2(-x)$. It is thus possible, with three selection openings located at D, $D_1(x)$, $D_2(-x)$, and with three detectors, to simultaneously obtain three analyses and three pictures of the surface of the sample, corresponding to particles with a time of flight $t_s$, $t_s+\Delta t_s$ and $t_s-\Delta t_s$, taking care to change over the detectors to the scan rate to take the permutation of the scan direction into account.

In FIG. 7, in addition to the detector 8 placed at the point D, two detectors 8a and 8b are placed, respectively, behind openings at the point $D_1(x)$ and $D_2(-x)$, and are connected to two output terminals 15 and 16 of the analyzer by a change-over device 17. This change-over device 17 has a control input connected to an output of the deflection signals generator 10 to receive a control signal synchronized with the line scan. Three images representing the surface of the sample 3 for the times of flight $t_s$, $t_s-\Delta t_s$, and $t_s+\Delta t_s$, can be restored by means of three cathode tubes (not shown). Their control grids are respectively connected to the outputs of the three detectors 8, 8a, 8b and their respective deflection means are connected to an output of the generator 10. Naturally, a greater number of detectors may be used to obtain simultaneous analysis on the basis of a greater number of times of flight, by aligning them on the straight line $D_1(x)D_2(-x)$.

The invention can be applied to many types of analyzers, and their primary particles may be photons (in the case of the second alternative embodiment only), electrons, positive ions or negative ions. The secondary particles may be electrons, positive ions or negative ions.

The invention is not limited to the above-mentioned embodiments. In particular, the deflection devices may be of the electrostatic type as well as the magnetic type or they may be a combination of these two.

What is claimed is:

1. A method for time-of-flight analysis comprising the steps of:
   periodically scanning a surface of a solid sample to be analyzed by deflection of a beam of particles called primary particles, to liberate so-called secondary particles from the sample at the impact points of the beam of primary particles with the surface of the solid sample, to thereby generate points of emission of the secondary particles;

ionizing the secondary particles, some of which may be already ionized;

accelerating the secondary particles by an electrical field;

forming a beam of secondary particles, and making it travel through a path which is long enough for secondary particles with different energy levels or different masses to have substantially different times of flight;

then discriminating among the secondary particles on the basis of their time-of-flight differences, by bringing the secondary particles with a given time of flight into a predetermined direction, irrespectively of the place, on the sample, from which they have been liberated, in deflection the beam of secondary particles along an angle which may vary according to the point of emission of the secondary particles, and at periodic instants having a constant phase shift with respect to the deflection of the primary particles which liberated the secondary particles from the sample.

2. A method according to claim 1 wherein, to deflect the primary particles beam and to deflect a secondary particles beam, distinct deflection means are used with one and the same fixed deflection period, and the value of the phase shift is adjusted as a function of the given time of flight, by delaying the means for deflecting the secondary particles beam in relation to the means for deflecting the beam of primary particles.

3. A method according to claim 1, applied to primary particles and secondary particles having opposite charges wherein, to deflect the beam of primary particles and the beam of secondary particles, common deflection means are used; and wherein a given time of flight is selected, by modifying the common deflection time.

4. A method according to claim 1 wherein, furthermore, an image of the sample to be analyzed is generated by deflecting the electron beam of a cathode tube in a scan homologous to the deflection applied to the secondary particles beam, and by modulating an intensity of this electron beam as a function of the measurement of the secondary particles brought into the pre-determined direction.

5. A method according to claim 1 wherein, to achieve simultaneous discrimination between secondary particles having a time of flight $t_S$ and secondary particles having a time of flight $t_S + \Delta t_S$.

a selection is made of the secondary particles brought into the predetermined direction corresponding to the given time of flight ts and in measuring this current of secondary particles;

a selection is made of the secondary particles, respectively deflected in two directions which are symmetrical with the pre-determined direction contained in a plane parallel to the line scan direction, and the two flows of secondary particles thus selected are measured alternately at the line scanning rate.

6. A device for time-of-flight analysis of secondary particles, liberated at impact points of a beam of primary particles with a surface of a solid sample to thereby generate points of emissions of the secondary particles comprising:

means to periodically scan by deflection the surface of the solid sample to be analyzed with said beam of primary particles, to liberate particles, called secondary particles from the sample at the impact points and to ionize them;

means to accelerate the secondary particles by an electrical field, to thereby form a secondary particles beam and to make it travel on a path which is long enough for secondary particles with different energy levels or different masses to have substantially different times of flight;

means to discriminate among the secondary particles on the basis of their time-of-flight differences, said discriminating means comprising:

means to deflect the secondary particles beam at an angle which is variable as a function of the point of emission of the secondary particles beam, and at periodic instants with a constant phase shift in relation to the deflection that the scanning means have applied previously to the primary particles beam which has liberated these secondary particles;

means to select and measure the flow of secondary particles brought into the pre-determined direction.

7. A device according to claim 6, wherein the means to deflect the secondary particles beam are distinct from the means to deflect the primary particles beam, and accomplish deflection having the same period as that achieved by the means to deflect the primary particles beam, but with a constant, adjustable delay, and comprise a delay device which is adjustable as a function of the given time of flight.

8. A device according to claim 6 for primary particles and secondary particles having opposite charges, wherein the means to deflect the secondary particles beam are the same as the means to deflect the primary particles beam, and have a period which can be adjusted as a function of the given time of flight.

9. A device according to claim 6, further comprising a cathode tube to give an image of the sample, a control grid of this tube being controlled by a measurement signal given by means to measure the flow of the secondary particles brought to the pre-determined direction, a deflection means of this tube being controlled by deflection signals given by the means to deflect the secondary particles beam.

10. A device according to claim 6, further comprising:

means to select and measure two flows of secondary particles corresponding to a first time of flight $t_s + \Delta t_s$; these means being arranged symmetrically with respect to the means to select and measure the flow of secondary particles corresponding to a second time of flight $t_s$ on a straight line parallel to the line scan direction;

a change-over switch to select one of these two flows of secondary particles at the line scan rate.

* * * * *